US008538045B2

(12) United States Patent
Zhang

(10) Patent No.: US 8,538,045 B2
(45) Date of Patent: Sep. 17, 2013

(54) DEVICE AND METHOD FOR COMPENSATING SUPPLY VOLTAGE FROM POWER SUPPLY AND ELECTRONIC APPARATUS

(75) Inventor: Xiao-Lian Zhang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 621 days.

(21) Appl. No.: 12/796,770

(22) Filed: Jun. 9, 2010

(65) Prior Publication Data
US 2011/0013784 A1    Jan. 20, 2011

(30) Foreign Application Priority Data
Jul. 17, 2009    (CN) .......................... 2009 1 0304507

(51) Int. Cl.
*H03F 99/00*    (2009.01)
(52) U.S. Cl.
USPC .......................................... 381/121
(58) Field of Classification Search
USPC ............................ 381/120, 121, 55, 59, 94.1
See application file for complete search history.

(56) References Cited

U.S. PATENT DOCUMENTS

| 6,469,240 | B2 | 10/2002 | Pachet et al. | |
|---|---|---|---|---|
| 6,816,007 | B1 | 11/2004 | Sahyoun | |
| 2005/0285682 | A1* | 12/2005 | Lee et al. | 330/297 |
| 2012/0008796 | A1* | 1/2012 | Furge | 381/94.1 |

FOREIGN PATENT DOCUMENTS

CN    2457826 Y    10/2001

* cited by examiner

*Primary Examiner* — Ping Lee
(74) *Attorney, Agent, or Firm* — Altis & Wispro Law Group, Inc.

(57) ABSTRACT

A device is used for compensating a supply voltage from a power supply, the supply voltage powers an audio device. The device includes a detecting circuit and a storing circuit. The detecting circuit is used for detecting an audio signal from the audio device, generating a first level signal when detecting that the audio signal has a first characteristic, and generating a second level signal when detecting that the audio signal has a second characteristic. The storing circuit is used for storing energy according to the first level signal, and releasing energy to increase the supply voltage according to the second level signal. A related method and electronic apparatus are also provided.

14 Claims, 3 Drawing Sheets

DEVICE AND METHOD FOR COMPENSATING SUPPLY VOLTAGE FROM POWER SUPPLY AND ELECTRONIC APPARATUS

BACKGROUND

1. Technical Field

The disclosed embodiments relate to devices and methods for voltage compensation.

2. Description of Related Art

As the rhythm of an audio signal changes the power drawn by the audio device varies. As known in the art, when the audio signal has a first characteristic, for example unaccented part of the audio signal, the audio device may consume less electric energy. When the audio signal has a second characteristic, for example a climax or accented part of the audio signal, the audio device may consume more electric energy.

As the supply voltage decreases and the audio signal has the second characteristic, the supply voltage may be not enough to power the audio device.

Therefore there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 1:
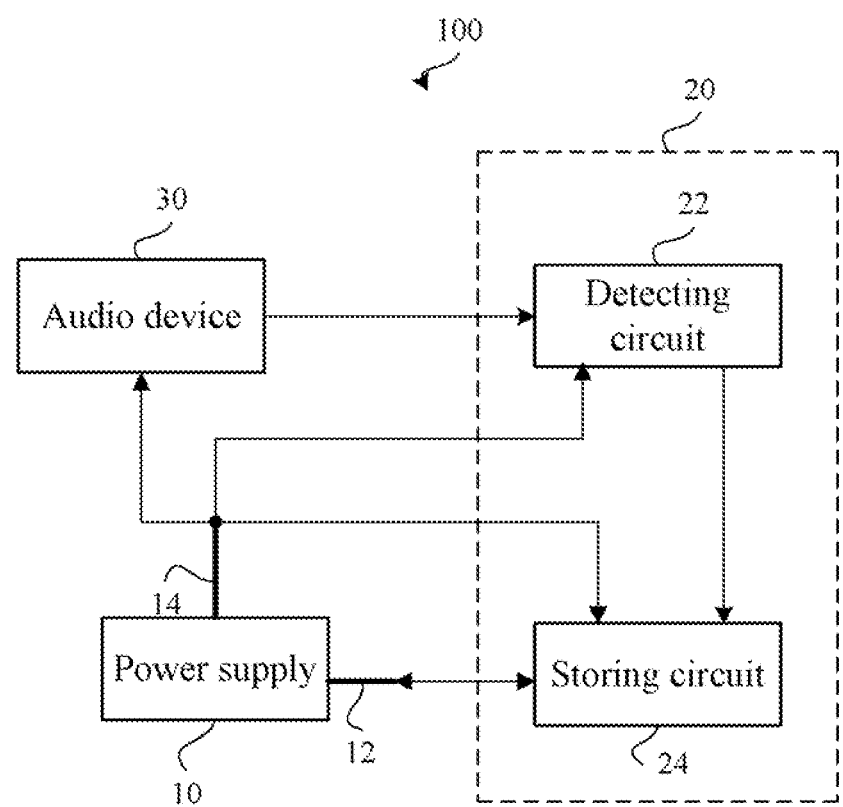
FIG. 1 is a block diagram of an electronic apparatus in accordance with an exemplary embodiment.

Referring to FIG. 1, an electronic apparatus 100 includes a power supply 10, a compensating device 20, and an audio device 30. The power supply 10 includes a first terminal 12 for providing an input voltage and a second terminal 14 for providing a supply voltage.

The compensating device 20 includes a detecting circuit 22 and a storing circuit 24. The detecting circuit 22 connects the power supply 10 and the audio device 30. The detecting circuit 22 is used for receiving the supply voltage and detecting an audio signal from the audio device 30, generating a first level signal when detecting that the audio signal has a first characteristic, for example unaccented part of the audio signal; and generating a second level signal when detecting that the audio signal has a second characteristic, for example a climax or accented part of the audio signal.

In detail, the detecting circuit 22 detects the audio signal to generate a detecting voltage. The detecting circuit 22 further compares the detecting voltage with a reference voltage, when the detecting voltage is smaller than the reference voltage, the first characteristic is determined; when the detecting voltage is larger than the reference voltage, the second characteristic is determined.

The storing circuit 24 is connected to the power supply 10 and the detecting circuit 22. The storing circuit 24 is used for receiving the input voltage, storing energy according to the first level signal, and releasing energy to increase the supply voltage according to the second level signal. As the supply voltage from the power supply 10 decreases and the audio signal has a second characteristic, because the storing circuit 24 releases energy to increase the supply voltage, so the increased supply voltage is enough to power the audio device 30.

Figure 2:
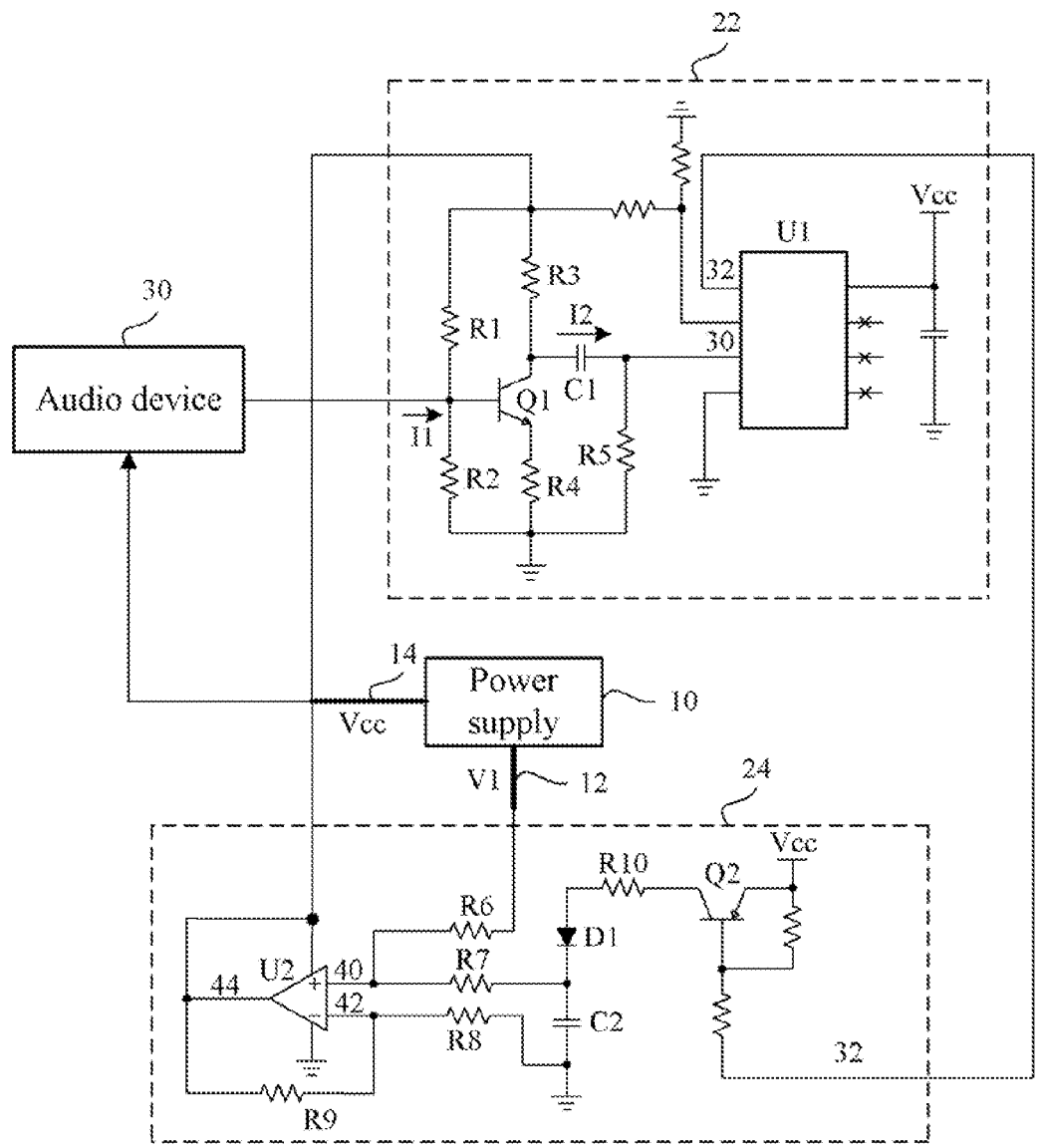
FIG. 2 is a circuit diagram of the electronic apparatus of FIG. 1 in accordance with the exemplary embodiment.

Referring to FIG. 2, the detecting circuit 22 includes a control unit U1, a first resistor R1, a second resistor R2, a third resistor R3, a fourth resistor R4, a fifth resistor R5, a first capacitor C1, and a transistor Q1. The control unit U1 includes an input pin 30 and an output pin 32. One end of the first resistor R1 is coupled to the second terminal 14 (for clarity and simplicity, the connection from the second terminal 14 to a node within the broken line boxes is shown as Vcc) of the power supply 10, the other end of the first resistor R1 is grounded through the second resistor R2. The audio device 30 is connected between the first resistor R1 and the second resistor R2. A base of the first transistor Q1 is coupled between the first resistor R1 and the second resistor R2, a collector of the first transistor Q1 is connected to the second terminal 14 through the third resistor R3, an emitter of the first transistor Q1 is grounded through the fourth resistor R4. One end of the first capacitor C1 connects the collector of first transistor Q1, the other end of the first capacitor C1 connects the input pin 30. One end of the fifth resistor R5 is coupled between the first capacitor C1 and the input pin 30, the other end of the fifth resistor R5 is grounded.

The storing circuit 24 includes a second transistor Q2, a second capacitor C2, an operating amplifier U2, a diode D1, a sixth resistor R6, a seventh resistor R7, a eighth resistor R8, a ninth resistor R9, and a tenth resistor R10. An emitter of the second transistor Q2 connects the second terminal 14 of the power supply 10, a base of the second transistor Q2 connects the output pin 32 of the control unit U1, a collector of the second transistor Q2 connects an anode of the diode D1 through the tenth resistor R10. One end of the second capacitor C2 connects a cathode of the diode D1, the other end of the second capacitor C2 is grounded. In this embodiment, the resistance of the sixth resistor R6 is equal to the resistance of the seventh resistor R7, the resistance of the eighth resistor R8 is equal to the resistance of the ninth resistor R9.

The operating amplifier U2 includes a non-inverted input terminal 40, an inverted input terminal 42, and an output terminal 44. One end of the sixth resistor R6 connects the first terminal 12 of the power supply 10, the other end of the sixth resistor R6 connects the non-inverted input terminal 40. One end of the seventh resistor R7 connects the non-inverted input terminal 40, the other end of the seventh resistor R7 is connected between the cathode of the diode D1 and the second capacitor C2. The eighth resistor R8 is connected between the inverted input terminal 42 and ground. The ninth resistor R9 is connected between the inverted input terminal 42 and the output terminal 44. The output terminal 44 connects the second terminal 14 of the power supply 10.

The principle of the electronic apparatus 100 is illustrated as follows: when the electronic apparatus 100 is powered on, the second capacitor C2 does not store any electric energy, thus the voltage across the second capacitor C2 is equal to zero, Vc2=0V. The voltage of the non-inverted input terminal 40 is illustrated by following formula:

$$\frac{V1 - V_{40}}{R6} = \frac{V_{40}}{R7},$$

wherein $V_{40}$ is the voltage of the non-inverted input terminal 40.

Because the resistance of the sixth resistor R6 is equal to the resistance of the seventh resistor R7, $V1=2V_{40}$. The voltage of the inverted input terminal 42 is illustrated by following formula:

$$\frac{Vcc - V_{42}}{R9} = \frac{V_{42}}{R8},$$

wherein $V_{42}$ is the voltage of the inverted input terminal 42. Because the resistance of the eighth resistor R8 is equal to the resistance of the ninth resistor R9 and the voltage of the inverted input terminal 42 is equal to the voltage of the non-inverted input terminal 40, $Vcc=2V_{42}=2V_{40}=V1$.

The current I1 of the audio signal is supplied to the base of the first transistor Q1, the first transistor Q1 amplifies the current I1 to the current I2, wherein I2=βI1 and β is the gain of the first transistor Q1. The input pin 30 of the control unit U1 receives the detecting voltage Vd, Vd=βI1×R1. The control unit U1 further presets the reference voltage, when the detecting voltage is smaller than the reference voltage, the control unit U1 generates a first level signal. When the detecting voltage is larger than the reference voltage, the control unit U1 generates a second level signal.

When the first level signal is supplied to the base of the second transistor Q2, the second transistor Q2 is turned on. The supply voltage Vcc charges up the second capacitor C2, so the voltage across the second capacitor C2 is Va. When the second level signal is supplied to the base of the second transistor Q2, the second transistor Q2 is turned off, and the voltage of the non-inverted input terminal 40 is illustrated by following formula:

$$\frac{V1 - V_{40}}{R6} = \frac{V_{40} - Va}{R7}, \quad 2V_{40} = V1 + Va.$$

The voltage of the inverted input terminal 42 is illustrated by following formula:

$$\frac{Vcc - V_{42}}{R9} = \frac{V_{42}}{R8}, \quad 2V_{42} = Vcc; \quad Vcc = 2V_{42} = 2V_{40} = V1 + Va.$$

Therefore, when the audio signal has a second characteristic, the supply voltage Vcc is increased, and the increased supply voltage is enough to power the audio device 30.

Figure 3:
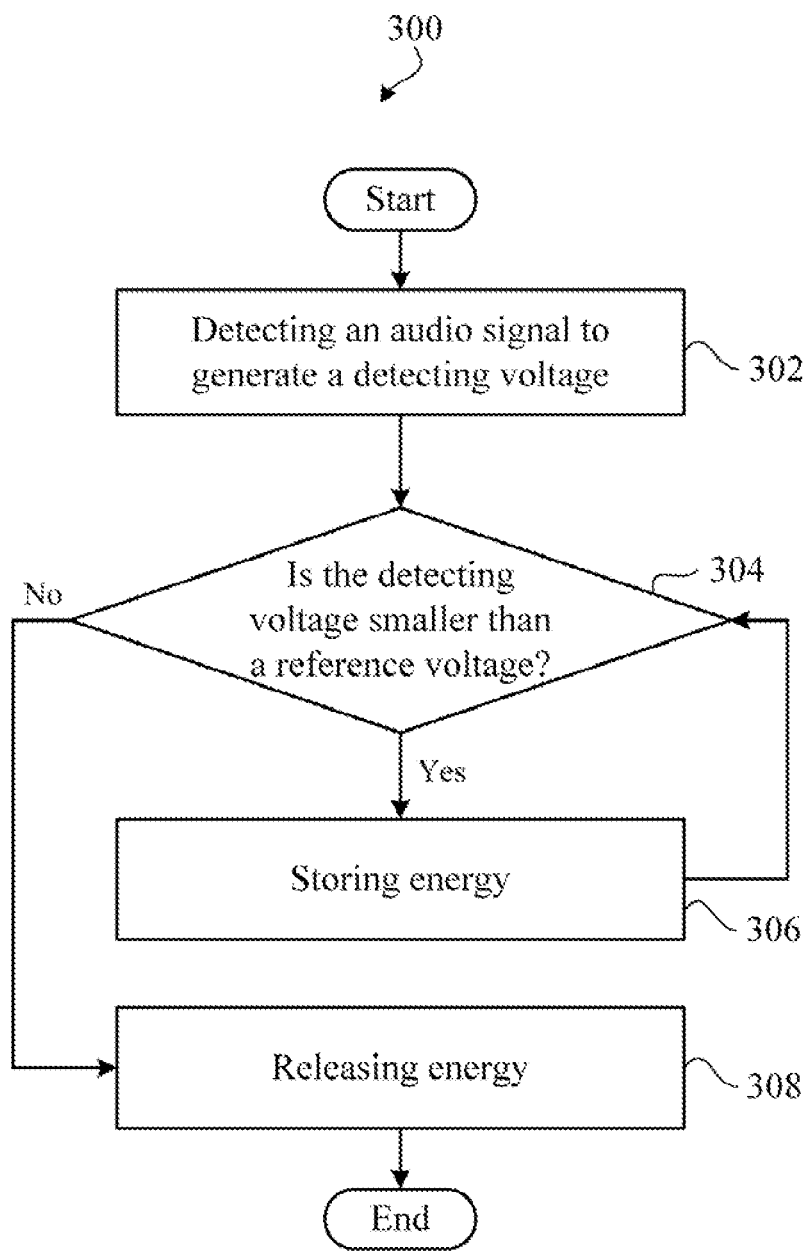
FIG. 3 illustrates a method for compensating a supply voltage from a power supply in accordance with the exemplary embodiment.

Referring to FIG. 3, a method for compensating a supply voltage from a power supply 10 is illustrated.

In step 302, the detecting circuit 22 detects an audio signal to generate a detecting voltage.

In step 304, the detecting circuit 22 further compares the detecting voltage with a reference voltage to determine whether the detecting voltage is smaller than the reference voltage.

In step 306, if the detecting voltage is smaller than the reference voltage, that is, the first characteristic of the audio signal is determined, the storing circuit 24 stores energy.

In step 308, if the detecting voltage is larger than the reference voltage, that is, the second characteristic of the audio signal is determined, the storing circuit 24 releases energy to increase the supply voltage. Therefore, the increased supply voltage is enough to power the audio device 30.

Further alternative embodiments will become apparent to those skilled in the art without departing from the spirit and scope of what is claimed. Accordingly, the present invention should be deemed not to be limited to the above detailed description, but rather only by the claims that follow and equivalents thereof.

What is claimed is:

1. A device for compensating a supply voltage from a power supply, the supply voltage used for powering an audio device, the device comprising:
   a detecting circuit for detecting an audio signal from the audio device, generating a first level signal when detecting that the audio signal has a first characteristic, and generating a second level signal when detecting that the audio signal has a second characteristic; and
   a storing circuit for storing energy according to the first level signal, and releasing the stored energy to increase the supply voltage according to the second level signal;
   wherein the power supply comprises a first terminal for providing the supply voltage and a second terminal for providing an input voltage, the detecting circuit comprises a control unit, a first resistor, a second resistor, a third resistor, a fourth resistor, a fifth resistor, and a first transistor, the control unit comprises an input pin and an output pin, one end of the first resistor connects the second terminal of the power supply, the other end of the first resistor is grounded through the second resistor, a terminal of the audio device is connected between the first resistor and the second resistor, the audio device is connected to the second terminal of the power supply, a base of the first transistor is connected between the first resistor and the second resistor, one end of the third resistor connects the second terminal of the power supply, the other end of the third resistor connects a collector of the first transistor, one end of the fourth resistor connects an emitter of the first transistor, the other end of the fourth resistor is grounded, the collector of the first transistor further connects the input pin, one end of the fifth resistor connects the input pin, the other end of the fifth resistor is grounded.

2. The device of amended claim 1, wherein the detecting circuit is used for detecting the audio signal to generate a detecting voltage and comparing the detecting voltage with a reference voltage, when the detecting voltage is smaller than the reference voltage, the first characteristic is determined, when the detecting voltage is larger than the reference voltage, the second characteristic is determined.

3. The device of amended claim 1, wherein the first characteristic is unaccented part of the audio signal, the second characteristic is a climax or accented part of the audio signal.

4. The device of claim 1, wherein the detecting circuit further comprises a first capacitor, one end of the first capacitor connects the collector of the first transistor, the other end of the first capacitor connects the input pin.

5. The device of amended claim 1, wherein the storing circuit comprises a second transistor, a second capacitor, an operating amplifier, a sixth resistor, a seventh resistor, a eighth resistor, and a ninth resistor, an emitter of the second transistor connects the second terminal of the power supply, a base of the second transistor connects the detecting circuit, one end of the second capacitor connects a collector of the second transistor, the other end of the second capacitor is grounded, the operating amplifier comprises a non-inverted input terminal, an inverted input terminal, and an output terminal, one end of the sixth resistor connects the first terminal of the power supply, the other end of the sixth resistor connects the non-inverted input terminal, one end of the seventh resistor connects the non-inverted input terminal, the other end of the seventh resistor is connected between the collector of the second transistor and the second capacitor, the eighth resistor is connected between the inverted input terminal and ground, the ninth resistor is connected between the inverted input terminal and the output terminal, the output terminal connects the second terminal of the power supply.

6. The device of claim 5, wherein the storing circuit further comprises a diode and a tenth resistor, one end of the tenth resistor connects the collector of the second transistor, the other end of the tenth resistor connects an anode of the diode, a cathode of the diode connects the second capacitor.

7. The device of claim 1, wherein the resistance of the sixth resistor is equal to the resistance of the seventh resistor, the resistance of the eighth resistor is equal to the resistance of the ninth resistor.

8. An electronic apparatus comprising:
an audio device;
a power supply for providing a supply voltage to power the audio device; and
a compensating device for compensating the supply voltage, the compensating device comprising:
a detecting circuit for detecting an audio signal from the audio device, generating a first level signal when detecting that the audio signal has a first characteristic, and generating a second level signal when detecting that the audio signal has a second characteristic; and
a storing circuit for storing energy according to the first level signal, and releasing the stored energy to increase the supply voltage according to the second level signal;
wherein the storing circuit comprises a second transistor, a second capacitor, an operating amplifier, a sixth resistor, a seventh resistor, a eighth resistor, and a ninth resistor, an emitter of the second transistor connects the second terminal of the power supply, a base of the second transistor connects the detecting circuit, one end of the second capacitor connects a collector of the second transistor, the other end of the second capacitor is grounded, the operating amplifier comprises a non-inverted input terminal, an inverted input terminal, and an output terminal, one end of the sixth resistor connects the first terminal of the power supply, the other end of the sixth resistor connects the non-inverted input terminal, one end of the seventh resistor connects the non-inverted input terminal, the other end of the seventh resistor is connected between the collector of the second transistor and the second capacitor, the eighth resistor is connected between the inverted input terminal and ground, the ninth resistor is connected between the inverted input terminal and the output terminal, the output terminal connects the second terminal of the power supply.

9. The electronic apparatus of amended claim 8, wherein the detecting circuit is used for detecting the audio signal to generate a detecting voltage and comparing the detecting voltage with a reference voltage, when the detecting voltage is smaller than the reference voltage, the first characteristic is determined, when the detecting voltage is larger than the reference voltage, the second characteristic is determined.

10. The electronic apparatus of amended claim 8, wherein the first characteristic is unaccented part of the audio signal, the second characteristic is a climax or accented part of the audio signal.

11. The electronic apparatus of amended claim 8, wherein the power supply comprises a first terminal for providing the supply voltage and a second terminal for providing an input voltage, the detecting circuit comprises a control unit, a first resistor, a second resistor, a third resistor, a fourth resistor, a fifth resistor, and a first transistor, the control unit comprises an input pin and an output pin, one end of the first resistor connects the second terminal of the power supply, the other end of the first resistor is grounded through the second resistor, a terminal of the audio device is connected between the first resistor and the second resistor, the audio device is connected to the second terminal of the power supply, a base of the first transistor is connected between the first resistor and the second resistor, one end of the third resistor is connected to the second terminal of the power supply, the other end of the third resistor connects a collector of the first transistor, one end of the fourth resistor connects an emitter of the first transistor, the other end of the fourth resistor is grounded, the collector of the first transistor further connects the input pin, one end of the fifth resistor connects the input pin, the other end of the fifth resistor is grounded.

12. The electronic apparatus of amended claim 11, wherein the detecting circuit further comprises a first capacitor, one end of the first capacitor connects the collector of the first transistor, the other end of the first capacitor connects the input pin.

13. The electronic apparatus of amended claim 8, wherein the storing circuit further comprises a diode and a tenth resistor, one end of the tenth resistor connects the collector of the second transistor, the other end of the tenth resistor connects an anode of the diode, a cathode of the diode connects the second capacitor.

14. The electronic apparatus of amended claim 8, wherein the resistance of the sixth resistor is equal to the resistance of the seventh resistor, the resistance of the eighth resistor is equal to the resistance of the ninth resistor.

* * * * *